(12) United States Patent
Wu et al.

(10) Patent No.: US 10,063,200 B2
(45) Date of Patent: Aug. 28, 2018

(54) FEEDBACK CIRCUIT FOR POWER AMPLIFIER

(71) Applicant: SKYWORKS SOLUTIONS, INC., Woburn, MA (US)

(72) Inventors: Andy Cheng Pang Wu, Camarillo, CA (US); Yu-Jui Lin, Glendale, CA (US); Peter Phu Tran, Corona, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/465,503

(22) Filed: Mar. 21, 2017

(65) Prior Publication Data
US 2017/0302239 A1    Oct. 19, 2017

Related U.S. Application Data

(63) Continuation of application No. 14/318,619, filed on Jun. 28, 2014, now Pat. No. 9,602,064.

(51) Int. Cl.
| H03G 3/30 | (2006.01) |
| H03G 1/00 | (2006.01) |
| H03F 1/34 | (2006.01) |
| H03F 3/195 | (2006.01) |
| H03F 3/24 | (2006.01) |
| H03F 1/02 | (2006.01) |
| H04B 1/40 | (2015.01) |

(52) U.S. Cl.
CPC ......... *H03G 1/0088* (2013.01); *H03F 1/0222* (2013.01); *H03F 1/342* (2013.01); *H03F 3/195* (2013.01); *H03F 3/245* (2013.01); *H03F 2200/156* (2013.01); *H03F 2200/451* (2013.01); *H04B 1/40* (2013.01)

(58) Field of Classification Search
CPC .................................. H03G 3/30; H03G 3/20
USPC .................................................. 330/282, 307
See application file for complete search history.

(56) References Cited

U.S. PATENT DOCUMENTS

| 3,255,419 A | 6/1966 | Knapton et al. |
| 3,539,936 A | 11/1970 | McGhee |
| 4,831,400 A | 5/1989 | Takami et al. |
| 4,855,685 A | 8/1989 | Hochschild |
| 6,104,246 A | 8/2000 | LaFerrara et al. |
| 6,882,226 B2 | 4/2005 | Cho et al. |
| 7,268,628 B2 * | 9/2007 | Noda ........................ H03F 1/34 330/308 |

(Continued)

*Primary Examiner* — Henry Choe
(74) *Attorney, Agent, or Firm* — Chang & Hale LLP

(57) ABSTRACT

Feedback circuit for power amplifier. In some embodiments, a radio-frequency amplifier can include a bipolar junction transistor configured to amplify a signal, and having an input and an output. The radio-frequency amplifier can further include a feedback circuit implemented between the output and input of the bipolar junction transistor. The feedback circuit can include a parallel assembly of a field-effect transistor and a resistive element such that the resistive element is bypassed when the field-effect transistor is ON and an overall resistance of the feedback circuit includes the resistive element when the field-effect transistor is OFF. Such a feedback circuit can be configured to be capable of providing a plurality of resistance values between the output and input of the bipolar junction transistor to facilitate different gains of the bipolar junction transistor.

20 Claims, 11 Drawing Sheets

(56) References Cited

U.S. PATENT DOCUMENTS

| | | | |
|---|---|---|---|
| 7,339,434 B1 | 3/2008 | Shirvani-Mandavi et al. | |
| 7,633,337 B2* | 12/2009 | Nam | H03F 1/342 |
| | | | 330/254 |
| 7,679,446 B2 | 3/2010 | Kim et al. | |
| 7,915,955 B2 | 3/2011 | Lin | |
| 8,149,057 B2 | 4/2012 | Iwamatsu | |
| 8,884,693 B2* | 11/2014 | Lee | H03G 3/002 |
| | | | 330/144 |
| 9,041,472 B2* | 5/2015 | Chen | H03F 3/19 |
| | | | 330/307 |
| 9,088,257 B2 | 7/2015 | Vice et al. | |
| 9,136,800 B2* | 9/2015 | Gaynor | H03F 3/189 |
| 2007/0075769 A1 | 4/2007 | Blon | |
| 2014/0320207 A1* | 10/2014 | Huang | H03G 1/0023 |
| | | | 330/254 |

* cited by examiner

FEEDBACK CIRCUIT FOR POWER AMPLIFIER

CROSS-REFERENCE TO RELATED APPLICATION(S)

This application is a continuation of U.S. application Ser. No. 14/318,619 filed Jun. 28, 2014, entitled SWITCHABLE FEEDBACK CIRCUIT FOR RADIO-FREQUENCY POWER AMPLIFIERS, the benefit of the filing date of which is hereby claimed and the disclosure of which is hereby expressly incorporated by reference herein in its entirety.

BACKGROUND

Field

The present disclosure relates to radio-frequency power amplifiers.

Description of the Related Art

In some radio-frequency (RF) applications, a power amplifier can include a feedback circuit that samples an amplified RF signal at the output and utilize the sampled signal to create a negative feedback. Such a feedback circuit can allow the power amplifier to operate in a stable manner.

In some RF applications, a power amplifier (PA) can include an amplifying transistor such as a heterojunction bipolar transistor (HBT). Such an HBT can receive an RF signal at its base, and the amplified RF signal can be output through its collector. A bias signal such as a bias voltage is typically provided to the base to operate the HBT.

SUMMARY

In some implementations, the present disclosure relates to a radio-frequency (RF) power amplifier (PA) circuit that includes a transistor having a base, a collector, and an emitter, with the transistor being configured to amplify an RF signal. The PA circuit further includes a switchable feedback circuit implemented between the collector and the base. The switchable feedback circuit is configured to provide a plurality of resistance values between the collector and the base.

In some embodiments, the transistor can be a bipolar junction transistor (BJT) such as a heterojunction bipolar transistor (HBT).

In some embodiments, the switchable feedback circuit can include an assembly having a parallel arrangement of a switch and a resistive element. The assembly can be implemented such that when the switch is ON, the resistive element is bypassed and when the switch is OFF, an overall resistance of the switchable feedback circuit includes the resistive element. The switchable feedback circuit can further include a second resistive element in series with the assembly such that the overall resistance is approximately the sum of resistance values of the resistive element of the assembly when the switch is OFF and the second resistive element. The second resistive element can have a resistance value selected to yield a first gain of the transistor. The resistive element of the assembly can have a resistance value selected so that the overall resistance yields a second gain of the transistor.

In some embodiments, the resistive element can include a resistor. The resistor can include, for example, a TaN thin film resistor.

In some embodiments, the switchable feedback circuit can further include a DC block capacitor to inhibit passage of a supply voltage from the collector to the base.

In some embodiments, the switchable feedback circuit can further include one or more additional assemblies in series with the assembly. Each additional assembly can have a parallel arrangement of a switch and a resistive element.

In some embodiments, the transistor can be part of a stage of an amplification path having a plurality of amplifier stages. Each of the plurality of amplifier stages can include the switchable feedback circuit.

According to a number of implementations, the present disclosure relates to a method for operating a radio-frequency (RF) power amplifier (PA). The method includes providing a transistor having a base, a collector, and an emitter, with the transistor being configured to amplify an RF signal. The method further includes selecting a resistance value from a plurality of resistance values provided by a feedback circuit between the collector and the base.

In some embodiments, the selecting can include performing a switching operation to select a path from a plurality of paths provided by the feedback circuit. The plurality of paths can include a first path and a second path. The first path can include a switch and the second path can include a resistive element such that when the switch is ON, the resistive element is bypassed and when the switch is OFF, an overall resistance of the switchable feedback circuit includes the resistive element.

In a number of teachings, the present disclosure relates to a power amplifier module that includes a packaging substrate configured to receive a plurality of components, and a power amplifier (PA) circuit implemented on a die. The PA circuit includes a transistor having a base, a collector, and an emitter, with the transistor being configured to amplify an RF signal. The module further includes a switchable feedback circuit implemented between the collector and the base. The switchable feedback circuit is configured to provide a plurality of resistance values between the collector and the base. The module further includes a plurality of connectors configured to provide electrical connections between the PA circuit, the switchable feedback circuit, and the packaging substrate.

In some embodiments, at least a portion of the switchable feedback circuit can be implemented in the same die as the PA circuit. In some embodiments, at least a portion of the switchable feedback circuit can be implemented in a die separate from the die associated with the PA circuit. In some embodiments, the die associated with the PA circuit can be, for example, an HBT die.

In accordance with some implementations, the present disclosure relates to a radio-frequency (RF) device that includes a transceiver configured to process RF signals, and an antenna in communication with the transceiver and configured to facilitate transmission of an amplified RF signal. The RF device further includes a power amplifier (PA) module connected to the transceiver and configured to generate the amplified RF signal. The PA module includes a PA circuit. The PA circuit includes a transistor having a base, a collector, and an emitter, with the transistor being configured to amplify an RF signal. The PA module further includes a switchable feedback circuit provided between the collector and the base. The switchable feedback circuit is configured to provide a plurality of resistance values between the collector and the base.

In some embodiments, the RF device can include a wireless device. The wireless device can be, for example, a portable device such as a cellular phone.

In some implementations, the present disclosure relates to a radio-frequency (RF) power amplifier (PA) circuit that includes a transistor having a base, a collector, and an emitter, with the transistor being configured to amplify an RF signal. The PA circuit further includes a bias circuit configured to provide a base bias signal to the base of the transistor. The PA circuit further includes a switchable base feed circuit implemented between the bias circuit and the base of the transistor. The switchable base feed circuit is configured to provide a plurality of different resistance values for the base bias signal between the bias circuit and the base of the transistor.

In some embodiments, the transistor can be a bipolar junction transistor (BJT) such as a heterojunction bipolar transistor (HBT). The base bias signal can include a base bias voltage signal.

In some embodiments, the base bias signal from the bias circuit can be selected for a high-power mode of operation of the transistor. The reduced bias signal can be configured for a low-power mode of operation of the transistor. The low-power mode can include an output power of, for example, approximately 2 dBm or less. The resistive element can have a resistance value selected to yield a desired linearity during a medium-power mode of operation of the transistor.

In some embodiments, the switchable base feed circuit can include a parallel arrangement of a first path and a second path. The first path can include a switch and the second path can include a resistive element implemented such that when the switch is ON, the base receives substantially the base bias signal from the bias circuit and when the switch is OFF, the base receives a reduced base bias signal due to the resistive element. The resistive element can include a resistor. The resistor can include, for example, a TaN thin film resistor.

In some embodiments, the transistor can be part of a stage of an amplification path having a plurality of amplifier stages. In some embodiments, each of the plurality of amplifier stages can include a switchable base feed circuit.

In some embodiments, the transistor can be part of one of a plurality of amplification paths. In some embodiments, each of the plurality of amplification paths can include a switchable base feed circuit.

In accordance with a number of implementations, the present disclosure relates to a method for operating a radio-frequency (RF) power amplifier (PA). The method includes providing a transistor having a base, a collector, and an emitter, with the transistor being configured to amplify an RF signal. The method further includes generating a bias signal for the base of the transistor. The method further includes routing the bias signal through a base feed circuit capable of providing a plurality of different resistance values for the bias signal. The plurality of resistance values are selected to facilitate different power modes of operation.

In some embodiments, the base feed circuit can include a plurality of paths having different resistance values. The routing can include performing a switching operation to select one of the plurality of paths. The plurality of paths can include a first path and a second path. The first path can include a switch and the second path can include a resistive element such that when the switch is ON, the base receives substantially the bias signal and when the switch is OFF, the base receives a reduced base bias signal due to the resistive element.

In some teachings, the present disclosure relates to a power amplifier module that includes a packaging substrate configured to receive a plurality of components. The module further includes a power amplifier (PA) circuit implemented on a die. The PA circuit includes a transistor having a base, a collector, and an emitter, with the transistor being configured to amplify an RF signal. The module further includes a bias circuit configured to provide a base bias signal to the base of the transistor. The module further includes a switchable base feed circuit implemented between the bias circuit and the base. The switchable base feed circuit is configured to provide a plurality of different resistance values for the base bias signal between the bias circuit and the base. The module further includes a plurality of connectors configured to provide electrical connections between the PA circuit, the bias circuit, and the packaging substrate.

In some embodiments, at least a portion of the switchable base feed circuit can be implemented on the same die as the PA circuit. In some embodiments, at least a portion of the bias circuit can be implemented on another die. In some embodiments, the die associated with the PA circuit can be an HBT die.

According to a number of implementations, the present disclosure relates to a radio-frequency (RF) device that includes a transceiver configured to process RF signals, and an antenna in communication with the transceiver. The antenna is configured to facilitate transmission of an amplified RF signal. The RF device further includes a power amplifier (PA) module connected to the transceiver. The PA module includes a PA circuit configured to generate the amplified RF signal. The PA circuit includes a transistor having a base, a collector, and an emitter, with the transistor being configured to amplify an RF signal. The PA module further includes a bias circuit configured to provide a base bias signal to the base of the transistor, and a switchable base feed circuit implemented between the bias circuit and the base. The switchable base feed circuit is configured to provide a plurality of different resistance values for the base bias signal between the bias circuit and the base.

In some embodiments, the RF device can includes a wireless device such as a cellular phone.

In some implementations, the present disclosure relates to a radio-frequency (RF) power amplifier (PA) circuit that includes a transistor having a base, a collector, and an emitter, with the transistor being configured to amplify an RF signal. The PA circuit further includes a switchable feedback circuit implemented between the collector and the base. The switchable feedback circuit is configured to provide a plurality of resistance values between the collector and the base. The PA circuit further includes a switchable base feed circuit coupled to the base of the transistor. The switchable base feed circuit is configured to provide a plurality of different resistance values for a bias signal provided to the base of the transistor.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

The present disclosure relates to U.S. patent application Ser. No. 14/318,620, titled "SWITCHABLE BASE FEED CIRCUIT FOR RADIO-FREQUENCY POWER AMPLI- FIERS," filed on even date herewith and hereby incorporated by reference herein in its entirety.

DETAILED DESCRIPTION OF SOME EMBODIMENTS

The headings provided herein, if any, are for convenience only and do not necessarily affect the scope or meaning of the claimed invention.

Some specifications for wireless devices have requirements or preferences for smaller sizes while having a capability of operating at multiple gain modes. A transceiver in such wireless devices typically has a specific dynamic range and needs to be able to operate at a lower power level. Accordingly, a power amplifier for such a transceiver is typically configured to have a higher gain in a high-power mode (HPM), as well as a lower gain in a low-power mode (LPM). In some situations, a second amplification path for the lower gain is not realizable or practical for the smaller-sized wireless devices.

In some situations, such reduced gain can be achieved by a variable attenuator added to an amplification path. However, such a solution can result in higher noise figure which is typically undesirable.

In some mobile phones, average power tracking (APT) systems are being implemented to step down the battery voltage with a DCDC converter to lower power levels to help improve current consumption. In some implementations, gain adjustment techniques as described herein can be combined with such an APT system to achieve one or more lower gain levels specified in low-power mode(s) while maintaining relatively low current and acceptable performance features. Such features can allow reduction in cost and size of wireless devices. Although described in the context of being utilized in combination with an APT system, it will be understood that one or more features of the present disclosure can be utilized independent of such a system or in combination with other power control systems.

Some specifications for wireless devices have requirements or preferences for smaller sized power amplifiers (PAs) having a capability of operating at reduced currents in a medium-power mode (MPM) and a low-power mode (LPM). By operating at reduced current(s), a wireless device such as a mobile phone can benefit from performance features such as improved battery life and talk time.

In some mobile phones, average power tracking (APT) systems are being implemented to step down the battery voltage with a DCDC converter to lower power levels to help improve current consumption. In a single-mode PA, reduction of current in MPM and LPM alone is generally not satisfactory, since its quiescent current (ICQ) will most likely be very high.

A configuration can be implemented so that a PA has a reduced quiescent current to reduce the current consumption. However, the PA's linearity can be adversely affected by such a reduction in quiescent current.

Figure 1:
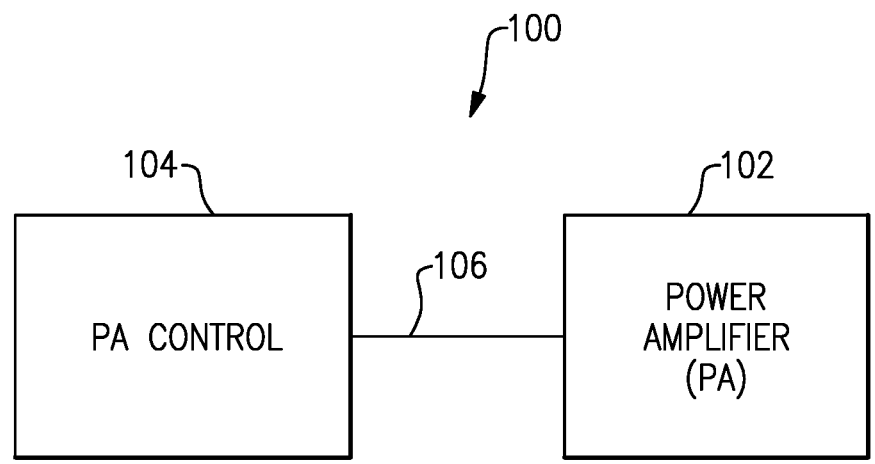
FIG. 1 shows a power amplifier (PA) control configuration having one or more features as described herein.

FIG. 1 shows that in some implementations, the present disclosure relates to a power amplifier (PA) control configuration 100. Such a configuration can facilitate control of a PA 102 by a control component 104 through a connection 106. Examples of how the PA 102 and/or the control component 104 can be configured and operated are described herein in greater detail.

Examples Related to Switchable Feedback Circuits

Figure 2:
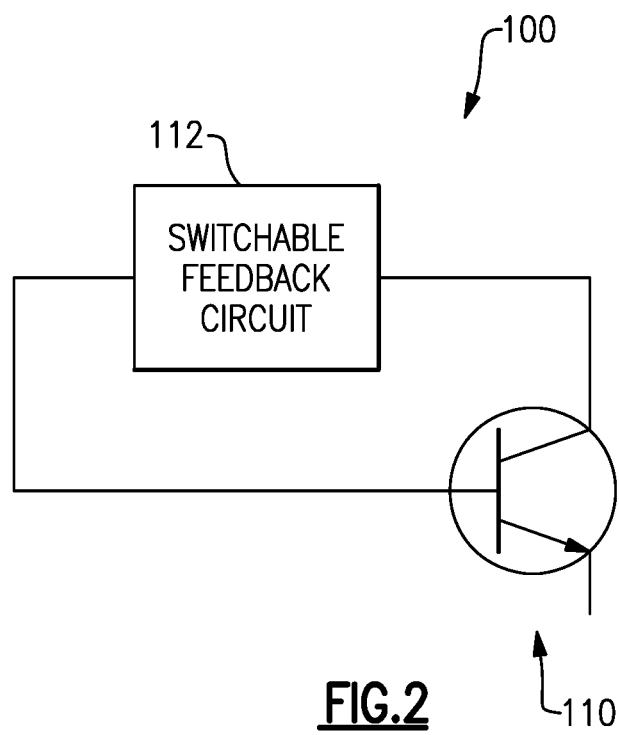
FIG. 2 shows that in some embodiments, the PA of FIG. 1 can include a transistor such as a heterojunction bipolar transistor (HBT), and the control component can include a switchable feedback circuit implemented between a collector and a base of the HBT.

FIG. 2 shows that in some implementations, the PA 102 of FIG. 1 can include a transistor such as a heterojunction bipolar transistor (HBT) 110. Although described in the context of an HBT, it will be understood that one or more features described herein can be applied in other types of transistors. The HBT 110 is sometimes referred to herein as a PA. It will be understood that such a PA can include other components not shown.

FIG. 2 shows that in some implementations, a control configuration 100 can include a switchable feedback circuit 112 provided between a collector and a base of the HBT 110. Various examples of such a switchable feedback circuit are described herein. For the purpose of description, and as described in greater detail herein, it will be assumed that a radio-frequency (RF) signal input is provided to the base of the HBT 110.

Figure 3:
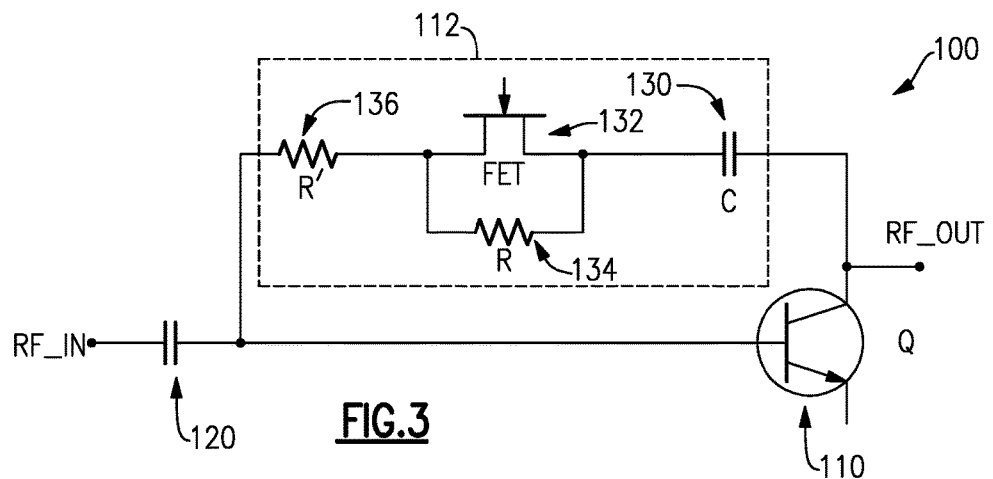
FIG. 3 shows an example of the switchable feedback circuit of FIG. 2, where the switchable feedback circuit includes a parallel assembly of a switch and a resistive element so as to provide a plurality of resistance values for the switchable feedback circuit.

In some embodiments, the switchable feedback circuit 112 of FIG. 2 can be configured so that the HBT yields a plurality of different levels of gain. By way of an example, FIG. 3 shows a configuration 100 where a switchable feedback circuit 112 includes a parallel assembly of a switch 132 (e.g., a bipolar field-effect transistor (BiFET)) and a resistive element 134 (e.g., a resistor (R)). The assembly (FET parallel with R) is shown to be connected in series between a capacitance 130 (e.g., a capacitor (C)) and a resistive element 136 (e.g., a resistor (R')). The capacitor 130 can be connected to the collector of the HBT 110, and the resistor 136 can be connected to the base of the HBT 110. The capacitor 130 can be configured to block the supply voltage VCC from reaching the base of the HBT 110.

In the example configuration 100 of FIG. 3, an RF signal being amplified can be received at an input node RF_in, and be routed to the base of the HBT 110 through, for example, a DC block capacitor 120. The amplified RF signal is shown to be routed to an output node RF_out from the collector of the HBT 110. For the purpose of description, bias (e.g., base bias) and supply (VCC) are omitted from FIG. 3 for clarity.

In a typical feedback circuit, a sampling of the amplified RF signal at the output can be fed back to the input, out of phase. Such a circuit can create a negative feedback which reduces the gain and stabilizes the operation of the HBT. Without the functionality provided by a switch in such a feedback circuit, there is typically only one feedback setting.

In the example switchable feedback circuit 112 as described herein (e.g., connected between the collector and base of the HBT 110), different resistance values can be provided depending on the state of the FET 132. For example, when the FET 132 is ON, the resistor 134 is bypassed, so that the overall resistance is approximately R' (due to resistor 136). When the FET 132 is OFF, the overall resistance is approximately R+R' (due to resistors 134 and 136). Such different resistance values can be utilized to adjust the amount of RF feedback (e.g., from the output to the input of the HBT 110). Thus, with the switchable feedback circuit 112, one can control the amount of feedback depending on the gain desired for a given operating mode.

In some implementations, a switchable feedback path as described herein and provided to a high-power mode (HPM) PA can be utilized to reduce the gain, so that a separate low-power mode (LPM) PA is not necessary. In some embodiments, one or both of the resistors 134, 136 can include devices such as a TaN thin film resistor.

Figure 4:
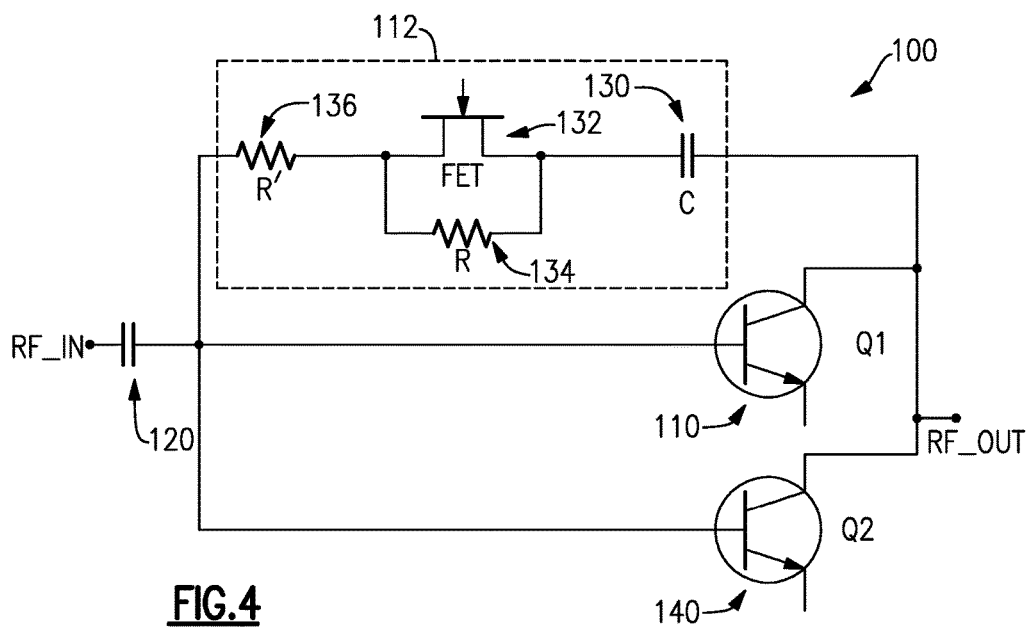
FIG. 4 shows that in some embodiments, a control configuration having one or more features as described herein can be utilized in a PA having a plurality of amplifier paths.

FIG. 4 shows that in some implementations, a control configuration 100 having one or more features as described herein can be utilized in a PA having a plurality of amplifier paths. Such amplifier paths can correspond to, for example, different modes or different bands.

Some of such amplifier paths may or may not have a switchable feedback circuit as described herein. For example, in FIG. 4, two amplifier paths can correspond to first and second HBTs 110, 140. In the example shown, both of the first and second HBTs 110, 140 are connected to a common RF signal input RF_in and a DC block capacitor 120. Outputs of the first and second HBTs 110, 140 are connected to a common RF signal output RF_out.

The first HBT 110 is shown to have a switchable feedback circuit 112 similar to that described in reference to FIG. 3. The second HBT 140, however, does not have such a switchable feedback circuit. In some implementations, each of a plurality of parallel amplification paths (such as the two-path example of FIG. 4) can include a switchable feedback circuit having one or more features as described herein.

Figure 5:
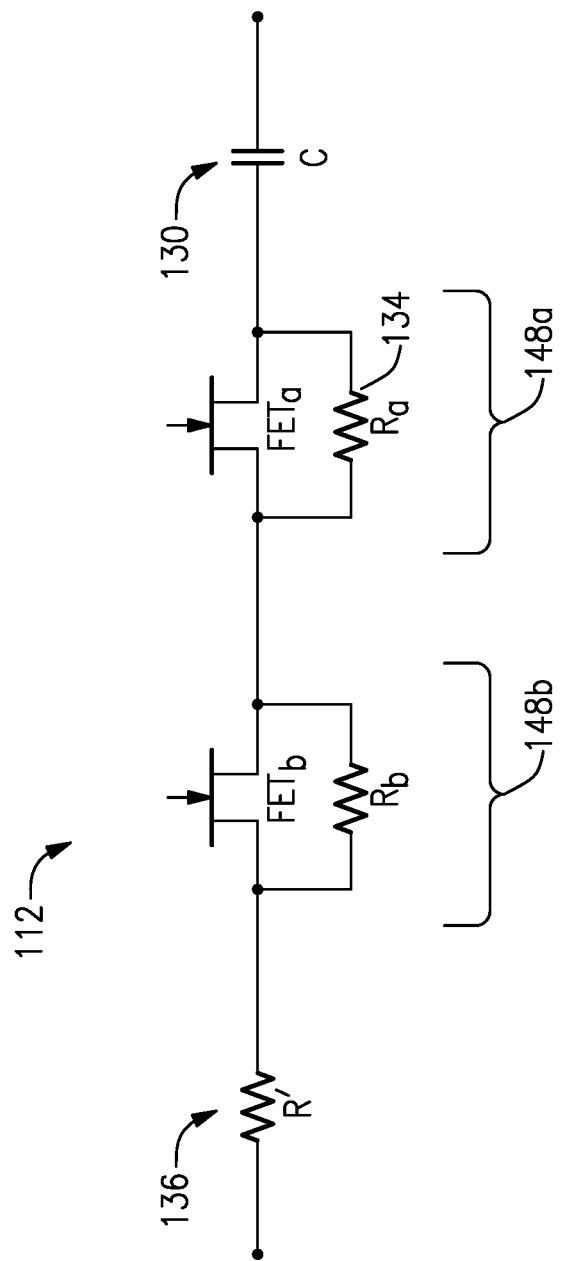
FIG. 5 shows that a switchable feedback circuit as described herein can be configured to provide more than two different resistance values.

In the example switchable feedback circuit described in reference to FIGS. 3 and 4, there are two possible values (R' or R'+R) for the overall resistance. In some implementations, more resistance values can be provided for a switchable feedback circuit. By way of an example, FIG. 5 shows a switchable feedback circuit 112 having two assemblies 148a, 148b (each assembly having an FET in parallel with a resistor) connected in series between a capacitor 130 and a resistor 136. In such a configuration, following overall resistance values can be obtained: R' when both $FET_a$ and $FET_b$ are ON; R'+$R_a$ when $FET_a$ is OFF and $FET_b$ is ON; R'+$R_b$ when $FET_a$ is ON and $FET_b$ is OFF; and R'+$R_a$+$R_b$ when both $FET_a$ and $FET_b$ are OFF.

One can see that additional resistance values can be obtained by adding more assemblies 148. Although described in the context of such assemblies arranged in series, it will be understood that other configurations can be implemented to vary the resistance in a switchable feedback circuit. For example, an SPNT switch can be provided, where "N" is greater than or equal to 2, and where the N throws are connected to different resistors.

Figure 6:
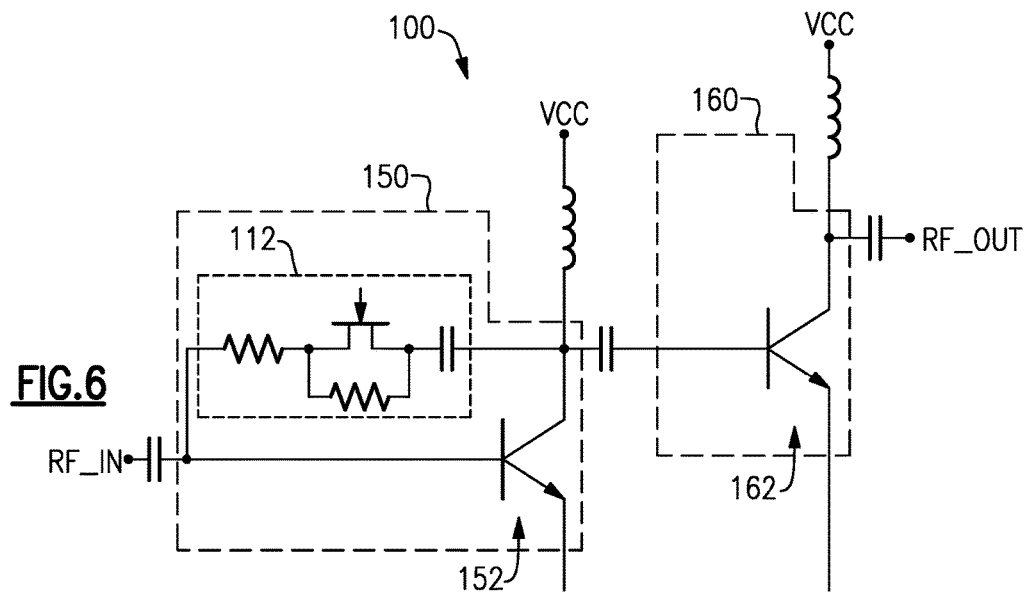
FIG. 6 shows that in some embodiments, a control configuration having one or more features as described herein can be implemented in some of a plurality of amplifier stages of a PA.
Figure 7:
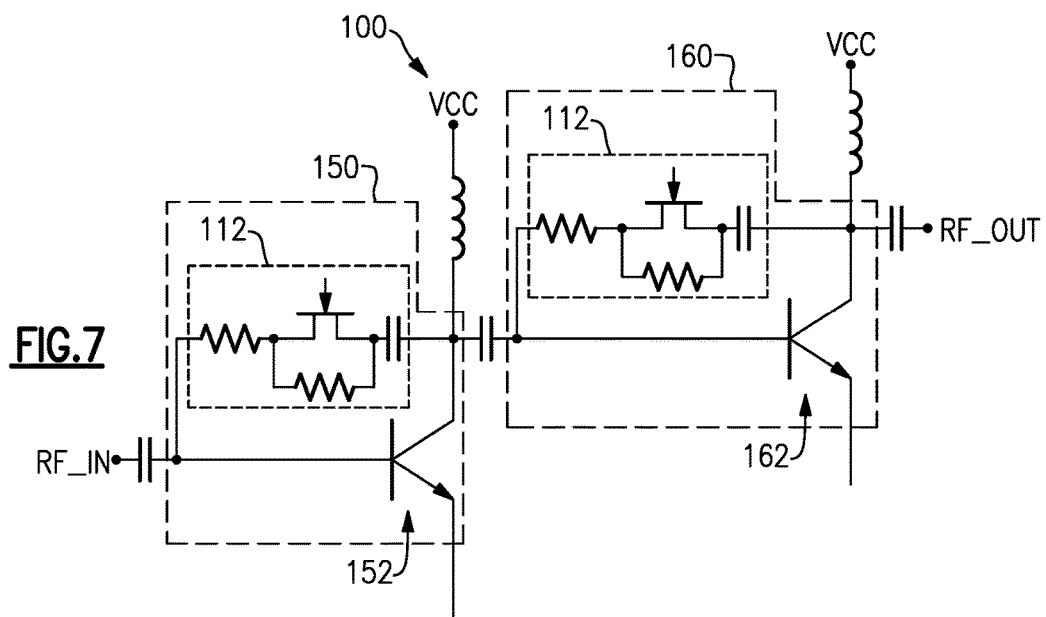
FIG. 7 shows that in some embodiments, a control configuration having one or more features as described herein can be implemented in each of a plurality of amplifier stages of a PA.

FIGS. 6 and 7 show that in some embodiments, a control configuration 100 having one or more features as described herein can be implemented in a PA having a plurality of amplifier stages for a given amplification path. For the purpose of description, two examples stages 150, 160 are shown; however, it will be understood that other numbers of stages can also be utilized.

In each of the examples shown in FIGS. 6 and 7, the first stage 150 is shown to include a PA transistor 152 whose base is connected to an RF input (RF_in), and its collector can act as an output of the first stage 150. The second stage 160 is shown to include a PA transistor 162 whose base is connected to the collector of the PA transistor 152, and its collector can act as an output of the second stage 160 which is in turn connected to an RF output (RF_out) of the example two-stage PA.

FIG. 6 shows that not all of the stages in a given amplification path need to be provided with a switchable feedback circuit. In the example shown, the first stage 150 is shown to include a switchable feedback circuit 112; but the second stage 160 does not include such a switchable feedback circuit.

FIG. 7 shows that more than one stage (e.g., every stage) in a given amplification path can be provided with switchable feedback circuits. In the example shown, each of the first and second stages 150, 160 is shown to include a switchable feedback circuit 112.

In some embodiments, a switchable feedback circuit as described herein can be implemented with an average power tracking (APT) system in a mobile phone. By using such a feedback circuit, an additional architecture is not needed to achieve a lower gain as specified for a low-power mode while maintaining adequate performance. This in turn can remove the need for an additional PA and a switch (e.g., a stacked pHEMT switch), to thereby reduce both cost and size.

Examples Related to Switchable Base Feed Circuits

Figure 8:
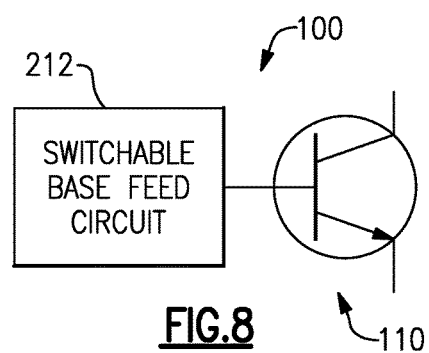
FIG. 8 shows that in some embodiments, the PA of FIG. 1 can include a transistor such as a heterojunction bipolar transistor (HBT), and the control component can include a switchable base feed circuit coupled to a base of the HBT.

FIG. 8 shows that in some implementations, the PA 102 of FIG. 1 can include a transistor such as a heterojunction bipolar transistor (HBT) 110. Although described in the context of an HBT, it will be understood that one or more features described herein can be applied in other types of transistors. The HBT 110 is sometimes referred to herein as a PA. It will be understood that such a PA can include other components not shown.

FIG. 8 shows that in some implementations, a control configuration 100 can include a switchable base feed circuit 212 connected to a base of the HBT 110. Various examples of such a switchable base feed circuit are described herein. For the purpose of description, and as described in greater detail herein, it will be assumed that a radio-frequency (RF) signal input is provided to the base of the HBT.

Figure 9:
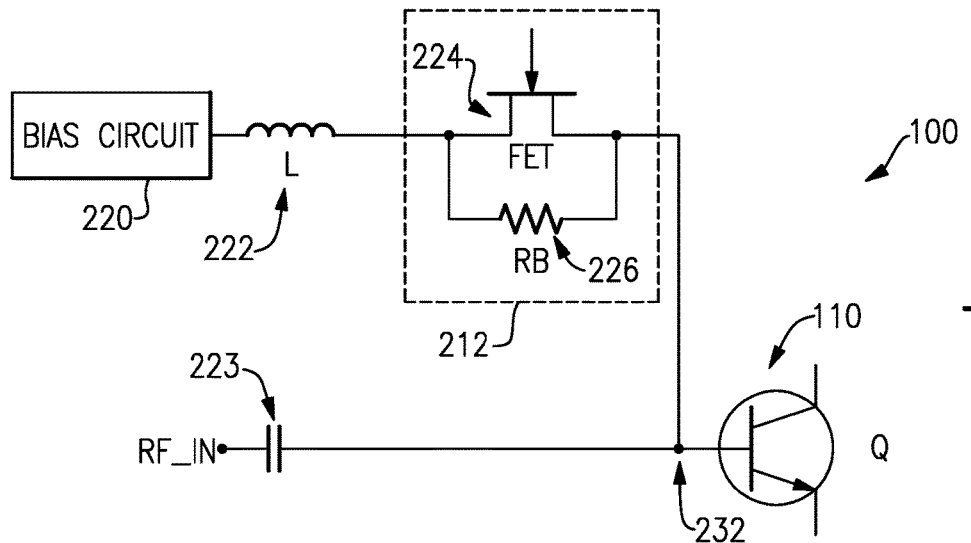
FIG. 9 shows an example configuration where the switchable base feed circuit of FIG. 8 can include a parallel assembly of a switch and a resistive element.

In some embodiments, the switchable base feed circuit 212 of FIG. 8 can be configured to provide different levels of bias voltages to the base of the HBT 110. By way of an example, FIG. 9 shows a configuration 100 where a switchable base feed circuit 212 includes a parallel assembly of a switch 224 (e.g., a bipolar field-effect transistor (BiFET)) and a resistive element 226 (e.g., a resistor (Rb)). The assembly 212 is shown to be connected in series between an inductance element 222 (e.g., an inductor (L)) and the base of the HBT 110 through a node 232. A bias circuit 220 is shown to provide a base bias voltage to the base through the inductor 222 and the assembly 212. In the example configuration 100 of FIG. 9, an RF signal input node (RF_in) is shown to be connected to the base of the HBT through a DC-block capacitance 223 (e.g., a capacitor (C)) and the node 232.

The foregoing example switchable base feed circuit 212 can be configured so that the FET 224 is ON when the HBT 110 operates in a high-power mode (HPM). A base bias voltage provided by the bias circuit 220 bypasses the resistor Rb; and thus remains generally the same at the node 232. In such a mode, quiescent current (ICQ) is relatively high (e.g., highest), and a specific PA linearity is desired and/or required.

When the FET 224 is turned OFF, the base bias voltage provided by the bias circuit 220 passes through the resistor Rb (226), to yield a reduced bias voltage at the base of the HBT 110. In some implementations, such a reduced base bias voltage can be selected for a low-power mode (LPM) of operation. Accordingly, a separate low-power mode PA is not needed.

In some embodiments, the resistor Rb (226) can include devices such as a TaN thin film resistor. Resistance associated with such a resistor can be selected to provide a desired linearity property in a medium-power mode (MPM). Typically, when the quiescent current is reduced to a very low level, undesirable effects such as gain expansion and non-linearity in the PA can occur. However, with the linearizing effect of the selected resistor Rb (226), the PA can be operated in a linearized manner in the MPM with a lowered quiescent current.

In some embodiments, the lowered quiescent current can in turn yield a LPM configuration that meets a very stringent specification of, for example, a 2 dBm current in the PA. Thus, the switchable base feed circuit 212 can provide beneficial features for both of the MPM and LPM.

Figure 10:
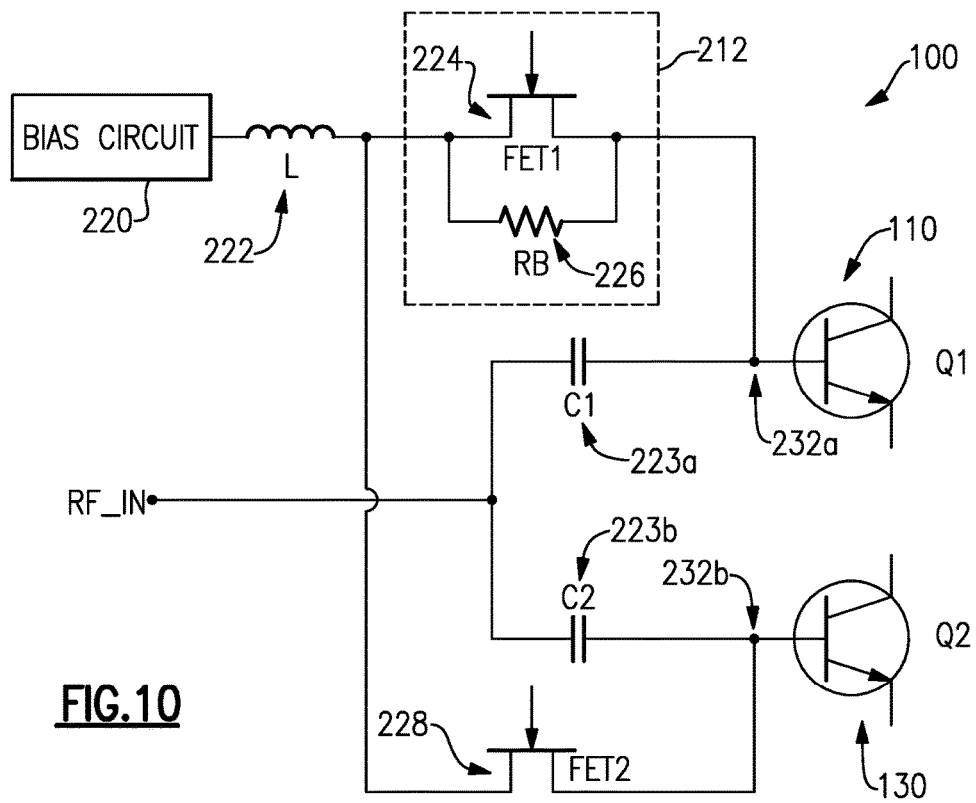
FIG. 10 shows that in some embodiments, a control configuration having one or more features as described herein can be utilized in a PA having a plurality of amplifier paths.

FIG. 10 shows that in some implementations, a control configuration 100 having one or more features as described herein can be utilized in a PA having a plurality of amplifier paths. Such amplifier paths can correspond to, for example, different modes or different bands.

Some of such amplifier paths may or may not have a switchable base feed circuit as described herein. For example, in FIG. 10, two amplifier paths can correspond to first and second HBTs 110, 130. The first HBT 110 is shown to receive its base bias signal through a switchable base feed circuit 212 having a first FET 224 (FET1) connected in parallel with a resistor (Rb) 226. The switchable base feed circuit 212 can operate in a similar manner as that described in reference to FIG. 9, so as to facilitate providing of a reduced base bias voltage to the first HBT 110. The base of the first HBT 110 is further shown to be connected to an RF signal input node (RF_in) through a DC-block capacitance 223a (e.g., a capacitor (C1)) and a node 232a.

The second HBT 130 is shown to receive its base bias signal through a second FET 228 (FET2). The second FET 228 can be turned ON when the second HBT 130 is in operation. In such a state, the first amplifier path can be turned OFF (e.g., by an FET (not shown) before or after the switchable base feed circuit 212). When the first HBT 110 is in operation, the switchable base feed circuit 212 can operate as described in reference to FIG. 9, and the second FET 228 can be turned OFF. The base of the second HBT 130 is further shown to be connected to the RF signal input node (RF_in) through a DC-block capacitance 223b (e.g., a capacitor (C2)) and a node 232b.

Figure 11:
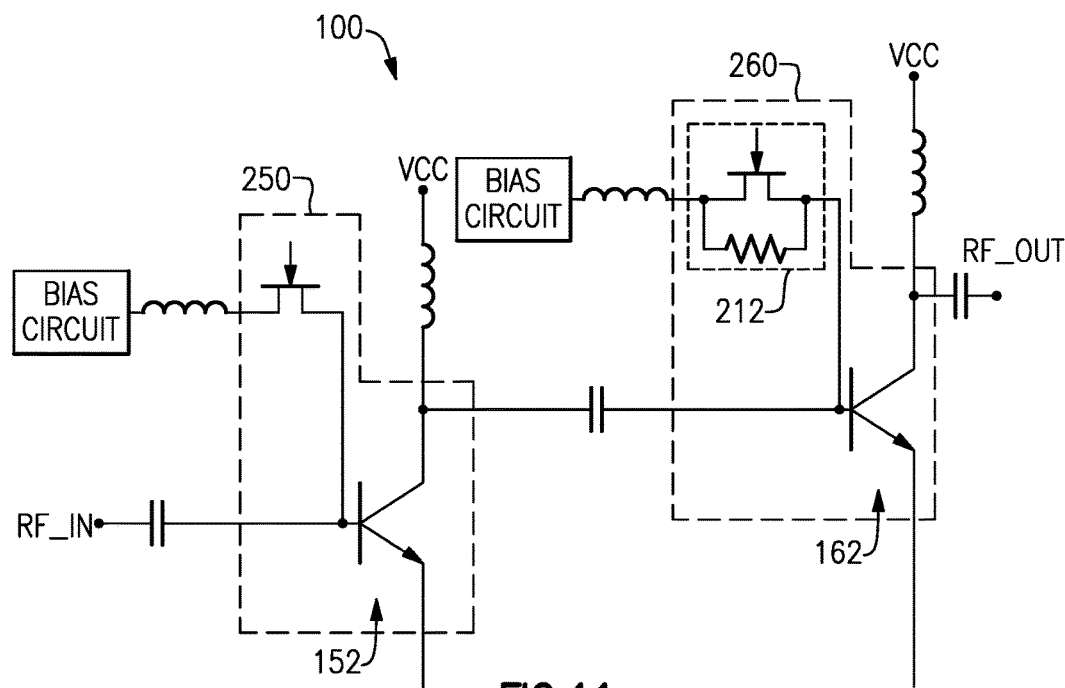
FIG. 11 shows that in some embodiments, a control configuration having one or more features as described herein can be implemented in a PA having a plurality of amplifier stages for a given amplification path.
Figure 12:
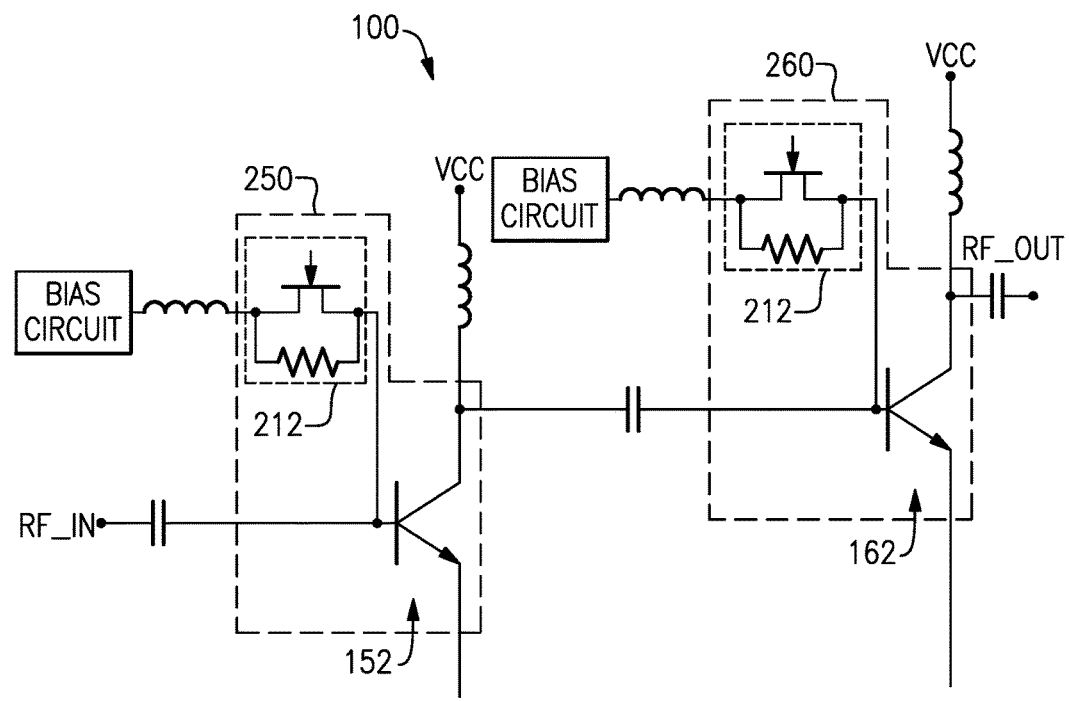
FIG. 12 shows that in some embodiments, more than one stage in a given amplification path can be provided with switchable base feed circuits.

FIGS. 11 and 12 show that in some embodiments, a control configuration 100 having one or more features as described herein can be implemented in a PA having a plurality of amplifier stages for a given amplification path. For the purpose of description, two examples stages 250, 260 are shown; however, it will be understood that other numbers of stages can also be utilized.

In each of the examples shown in FIGS. 11 and 12, the first stage 250 is shown to include a PA transistor 152 whose base is connected to an RF input (RF_in), and its collector can act as an output of the first stage 250. The second stage 260 is shown to include a PA transistor 162 whose base is connected to the collector of the PA transistor 152, and its collector can act as an output of the second stage 260 which is in turn connected to an RF output (RF_out) of the example two-stage PA.

FIG. 11 shows that not all of the stages in a given amplification path need to be provided with a switchable base feed circuit. In the example shown, the second stage 260 is shown to include a switchable base feed circuit 212; but the first stage 250 does not include such a switchable base feed circuit.

FIG. 12 shows that more than one stage (e.g., every stage) in a given amplification path can be provided with switchable base feed circuits. In the example shown, each of the first and second stages 250, 260 is shown to include a switchable base feed circuit 212.

In the various examples described herein in reference to FIGS. 9-12, switchable base feed circuits 212 are depicted as having one resistance that can be introduced into the bias signal path or be bypassed. In some embodiments, a plurality of switchable resistances can be provided so as to allow introduction of more than one resistance values into the bias signal path. For example, a plurality of assemblies similar to the switchable base feed circuits 212 of FIGS. 9-12 can be connected in series to provide such functionality where one or more resistances can be introduced into the bias signal path in a switchable manner.

Figure 13:
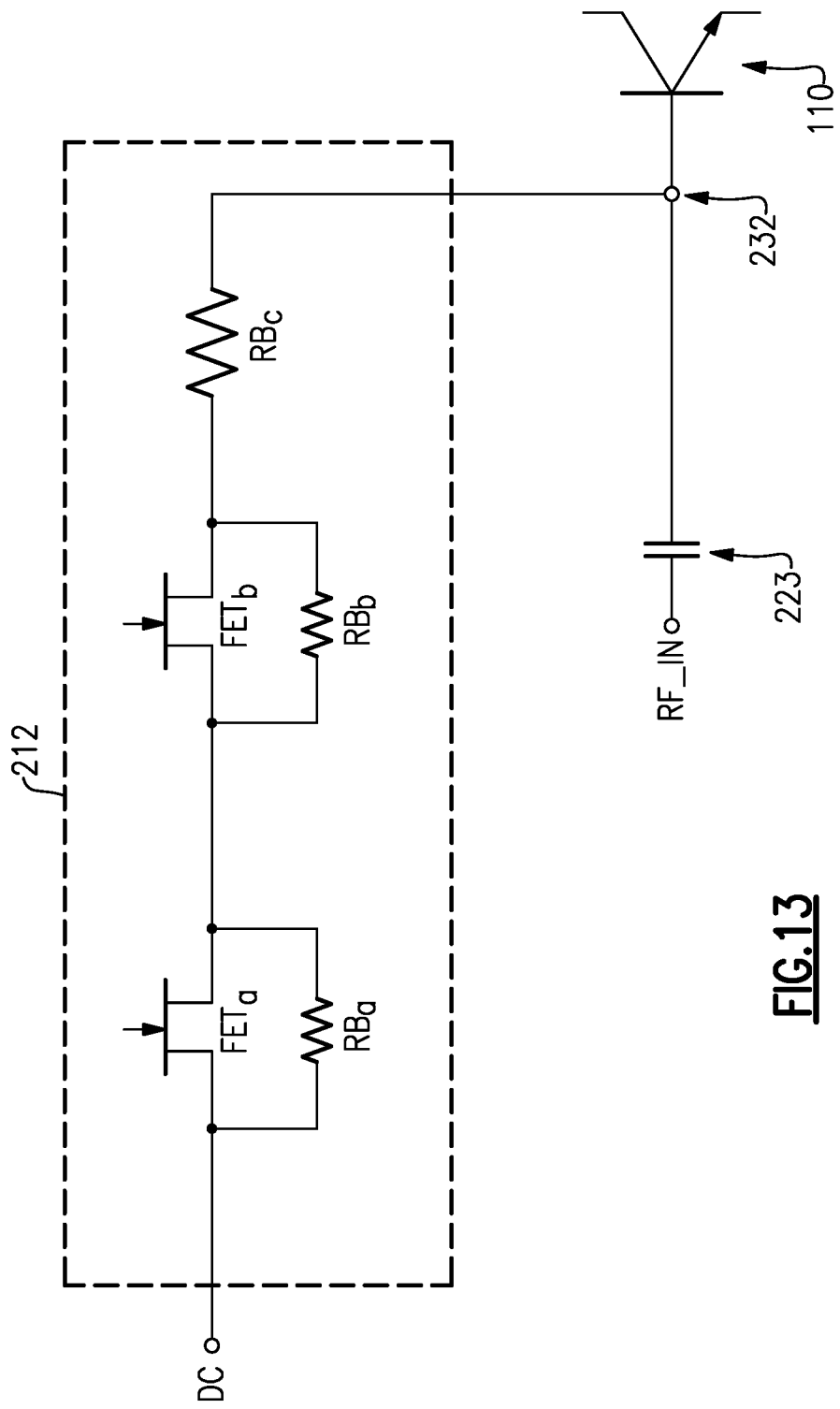
FIG. 13 shows that a switchable base feed circuit as described herein can be configured to provide more than two different resistance values.

FIG. 13 shows an example configuration of a switchable base feed circuit 212 having a plurality of resistance/switch assemblies connected in series so as to yield multiple resistance values between a DC node (e.g., from a bias circuit) and a base node 232 of a transistor 110 (e.g., an HBT). More particularly, the switchable base feed circuit 212 is shown to include a first switchable resistance assembly of a first resistance (e.g., a resistor) $RB_a$ arranged in parallel with a first switch $FET_a$. A second switchable resistance assembly (of a second resistance (e.g., a resistor) $RB_b$ arranged in parallel with a second switch $FET_b$) is shown to be connected in series with the first switchable resistance assembly. A third resistance (e.g., a resistor) $RB_c$ is shown to be connected in series with the second switchable resistance assembly.

Accordingly, a number of total resistance (R_total) values can be provided between the DC node and the base node 232. Such resistance values and their corresponding switch states are listed in Table 1.

TABLE 1

| Mode | $FET_a$ state | $FET_b$ state | R_total |
|---|---|---|---|
| 1 | ON | ON | $RB_c$ |
| 2 | ON | OFF | $RB_b + RB_c$ |
| 3 | OFF | ON | $RB_a + RB_c$ |
| 4 | OFF | OFF | $RB_a + RB_b + RB_c$ |

One can see that the lowest resistance of $RB_c$ can be obtained for R_total by bypassing both of $RB_a$ and $RB_b$. Such a mode (Mode 1) can be implemented for a high-power mode (HPM) of operation. One can also see that the highest resistance of $RB_a + RB_b + RB_c$ can be obtained for R_total by switching in both of $RB_a$ and $RB_b$. Such a mode (Mode 4) can be implemented for a low-power mode (LPM) of operation. One can also see that an intermediate resistance of $RB_b + RB_c$ or $RB_a + RB_c$ can be obtained for R_total by switching in $RB_b$ or $RB_a$, respectively. Such a mode (Mode 2 or Mode 3) can be implemented for a medium-power mode (MPM) of operation. Based on the foregoing example, one can see that the switchable base feed circuit 212 of FIG. 13 can allow optimization of the base feed resistance for different modes (e.g., HPM, MPM, LPM).

In the example of FIG. 13, the switchable base feed circuit 212 is shown to be provided between the DC node and the base node 232. The base node 232 is also shown to receive an RF signal through an input node (RF_in) and a DC-block capacitance 223. It will be understood that such a configuration of the switchable base feed circuit 212 and the corresponding transistor 110 can be implemented in some of all of the various example PA architectures described herein (e.g., FIGS. 8-12). It will also be understood that the switchable base feed circuit 212 of FIG. 13 can replace or be implemented with the single-assembly switchable base feed circuits 212 of FIGS. 9-12.

Figure 14:
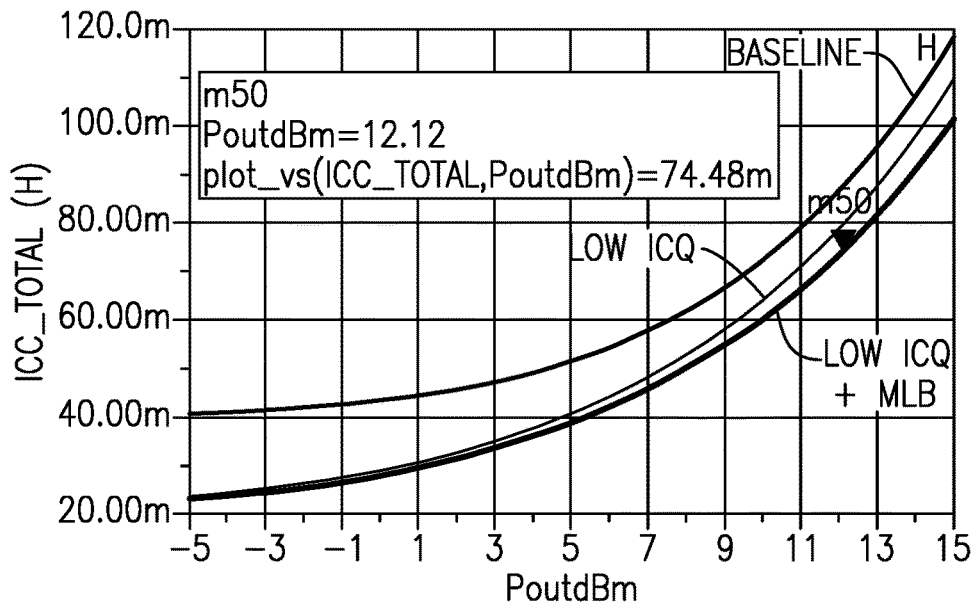
FIG. 14 shows collector currents (ICC) for three example configurations, including a control configuration having one or more features as described herein in reference to FIGS. 8-13.
Figure 15:
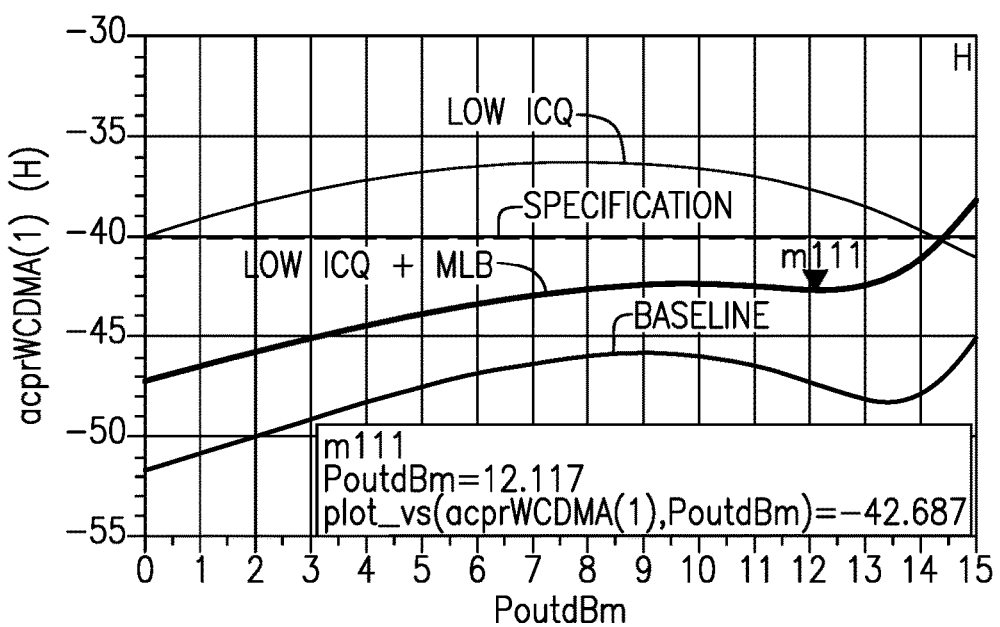
FIG. 15 shows linearity performance plots for the three example configurations of FIG. 14.
Figure 16:
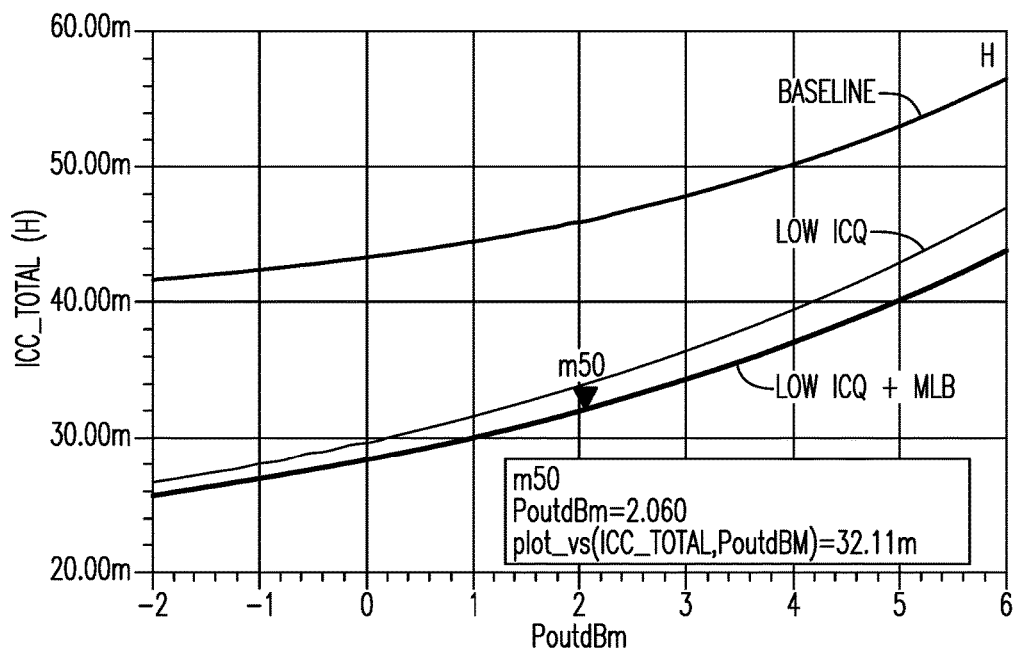
FIG. 16 shows collector current plots for the three example configurations of FIG. 14.

FIGS. 14-16 show examples of how performance can be improved for a PA controlled as described herein in reference to FIGS. 9-12. In FIG. 14, collector currents (ICC) for three example configurations are plotted against their respective power outputs (Pout) in a medium-power mode (e.g., VCC=1.1V, Pout=12 dBm at marker "m50"). The curve indicated as "Baseline" corresponds to a PA control configuration without the switchable base feed circuit (212 in FIGS. 9-12). The curve indicated as "Low ICQ" corresponds to a PA control configuration where the quiescent current has been lowered, but without the switchable base feed circuit. The curve indicated as "Low ICQ+MLB" corresponds to a PA control configuration where the quiescent current has been lowered, and includes the switchable base feed circuit.

Among the three example configurations, the "Baseline" configuration yields the best ACLR (adjacent channel leakage ratio) performance, but has the highest quiescent current (ICQ) and the collector current (ICC). By lowering the ICQ to facilitate a better LPM current, the PA configuration of "Low ICQ" does achieve such a lower ICQ throughout the amplification range (FIG. 14). However, the "Low ICQ" configuration is unable to meet the example linearity specification (dashed line indicated as "Specification") represented in the ACPR (adjacent channel power ratio) plots of FIG. 15 (also in the medium-power mode).

As described herein, the switchable base feed circuit 212 can improve the linearity in a medium-power mode while delivering a desired low-power mode current, with a lowered quiescent current. As FIG. 15 further shows, such a configuration ("Low ICQ+MLB") has acceptable linearity generally throughout the amplification range.

As described herein, the "Low ICQ+MLB" yields a desired low-power mode current, and such a current is represented in FIG. 16 that shows the same three example configurations in a low-power mode (e.g., VCC=0.6V, Pout=2 dBm). In the configurations depicted in FIG. 16, the total current can be recalculated with a DCDC converter efficiency (e.g., 75%) to yield, for the "Low ICQ+MLB" case, a total current of approximately 8.5 mA at 2 dBm power output (assuming 3.8V battery).

In some embodiments, a switchable base feed resistor as described herein can be implemented with an average power tracking (APT) system in a mobile phone. By using such a switchable base feed resistor, an additional architecture is not needed to reach lower current as specified for a low-power mode while maintaining adequate linearity in a medium-power mode. This in turn can remove the need for an additional PA and a switch (e.g., a stacked pHEMT switch), to thereby reduce both cost and size.

Examples Related to Combinations

Figure 17:
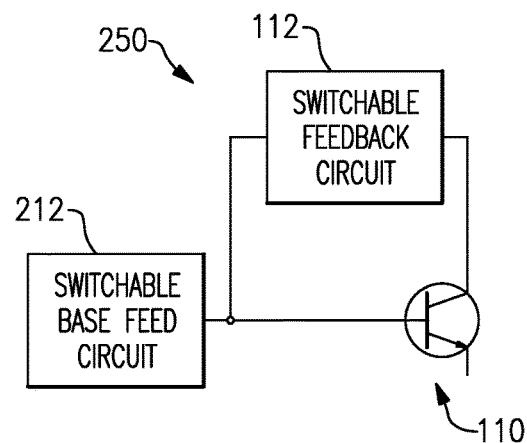
FIG. 17 shows that in some embodiments, the PA of FIG. 1 can include a transistor such as a heterojunction bipolar transistor (HBT), and the control component can include a switchable feedback circuit and a switchable base feed circuit.

FIG. 17 shows that in some embodiments, the PA 102 of FIG. 1 can be implemented as a PA configuration 250 that can include a transistor such as a heterojunction bipolar transistor (HBT) 110. The PA configuration 250 can include a switchable feedback circuit 112 having one or more features as described herein, and a switchable base feed circuit 212 having one or more features as described herein.

As described herein, the switchable feedback circuit 112 can be implemented between the collector and the base of the HBT 110. Additional details about the switchable feedback circuit 112 are described herein in reference to, for example, FIGS. 2-7. As also described herein, the switchable base feed circuit 212 can be implemented between a bias circuit and the base of the HBT 110. Additional details about the switchable base feed circuit 212 are described herein in reference to, for example, FIGS. 8-16.

In some embodiments, the PA configuration 250 of FIG. 17 can be implemented in some or all of the various example PA architectures described herein. It will also be understood that the PA configuration 250 of FIG. 17 can replace or supplement some or all of the switchable feedback circuits and/or the switchable base feed circuits as described herein.

Examples of Implementations in Products

Figure 18:
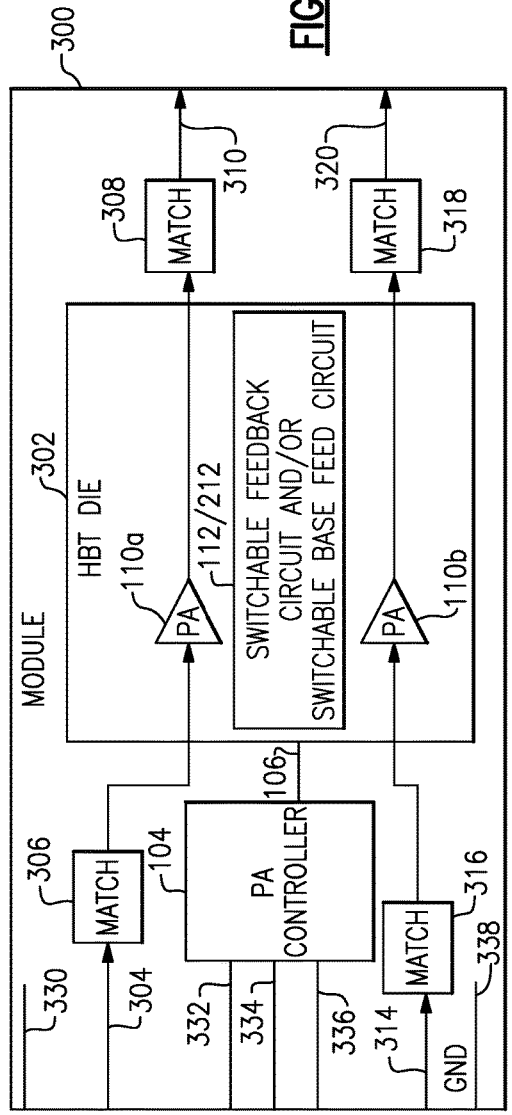
FIG. 18 depicts an example module having one or more features as described herein.
Figure 19:
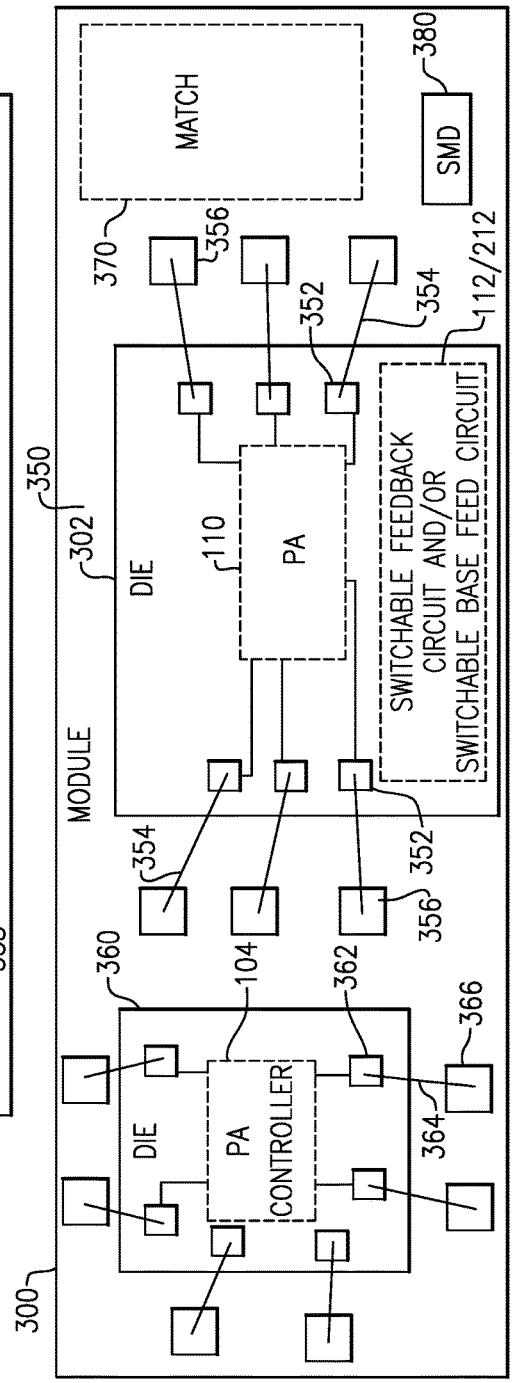
FIG. 19 shows an example where the module of FIG. 18 is implemented as a packaged module.

In some implementations, one or more features described herein can be included in a module. FIG. 18 schematically depicts an example module 300, and FIG. 19 shows an example where such a module can be implemented as a packaged module.

In FIG. 18, the example module 300 is shown to include a PA die 302 that includes a plurality of PAs (e.g., HBT PAs) 110. In some embodiments, the PA die 302 can include a switchable feedback circuit 112 and/or a switchable base feed circuit 212 as described herein. The PA die 302 is shown to be interconnected with a PA controller 104 (line 106). In some embodiments, some or all of the PA controller 104 can be implemented in a die that is separate from the PA die 302. In some embodiments, some or all of the PA controller 104 can be implemented in the same die as the PA die 302.

The module 300 can include connection paths 332, 334, 336 that facilitate various operations of the PA controller 104. The connection paths 332, 334, 336 can include, for example, connections for providing various currents and/or voltages as described herein. The module 300 can also include other connection paths 330, 338 to facilitate, for example, grounding and other power and/or signals.

In the example module 300, the PA die 302 is shown to include two example PAs 110a, 110b. However, it will be understood that other numbers of PA channels can be implemented. In the context of the two PA channels, the first PA 110a is shown to be provided with an input signal through an input connection 304. Such an input can be passed through a matching circuit 306, and an output of the PA 110a can also be passed through a matching circuit 308. The matched output signal can be output from the module through an output connection 310. Similarly, the second PA 110b is shown to be provided with an input signal through an input connection 314. Such an input can be passed through a matching circuit 316, and an output of the PA 110b can also be passed through a matching circuit 318. The matched output signal can be output from the module through an output connection 320.

In the example packaged module 300 of FIG. 19, a die 302 having a power amplifier circuit 110 and either or both of a switchable feedback circuit 112 and a switchable base feed circuit 212 as described herein are shown to be mounted or formed on the die 302. Such a die can be fabricated using a number of semiconductor process technologies. The die 302 can include a plurality of electrical contact pads 352 configured to allow formation of electrical connections 354 such as wirebonds between the die 302 and contact pads 356 formed on a packaging substrate 350.

A separate die 360 having a PA controller circuit 104 as described herein is shown to be mounted on the substrate 350. Such a die can be fabricated using a number of semiconductor process technologies. The die 360 can include a plurality of electrical contact pads 362 configured to allow formation of electrical connections 364 such as wirebonds between the die 360 and contact pads 366 formed on the packaging substrate 350.

The packaging substrate 350 can be configured to receive a plurality of components such as the dies 302, 360 and one or more SMDs (e.g., 380). In some embodiments, the packaging substrate 350 can include a laminate substrate.

In the example packaged module 300, a matching circuit 370 can be implemented on or within the substrate 350. Such a matching circuit 370 can include some or all of the match components 306, 308, 316, 318 described in reference to FIG. 18.

In some embodiments, the module 300 can also include one or more packaging structures to, for example, provide protection and facilitate easier handling of the module 300. Such a packaging structure can include an overmold formed over the packaging substrate 350 and dimensioned to substantially encapsulate the various circuits and components thereon.

It will be understood that although the module 300 is described in the context of wirebond-based electrical connections, one or more features of the present disclosure can also be implemented in other packaging configurations, including flip-chip configurations.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 20:
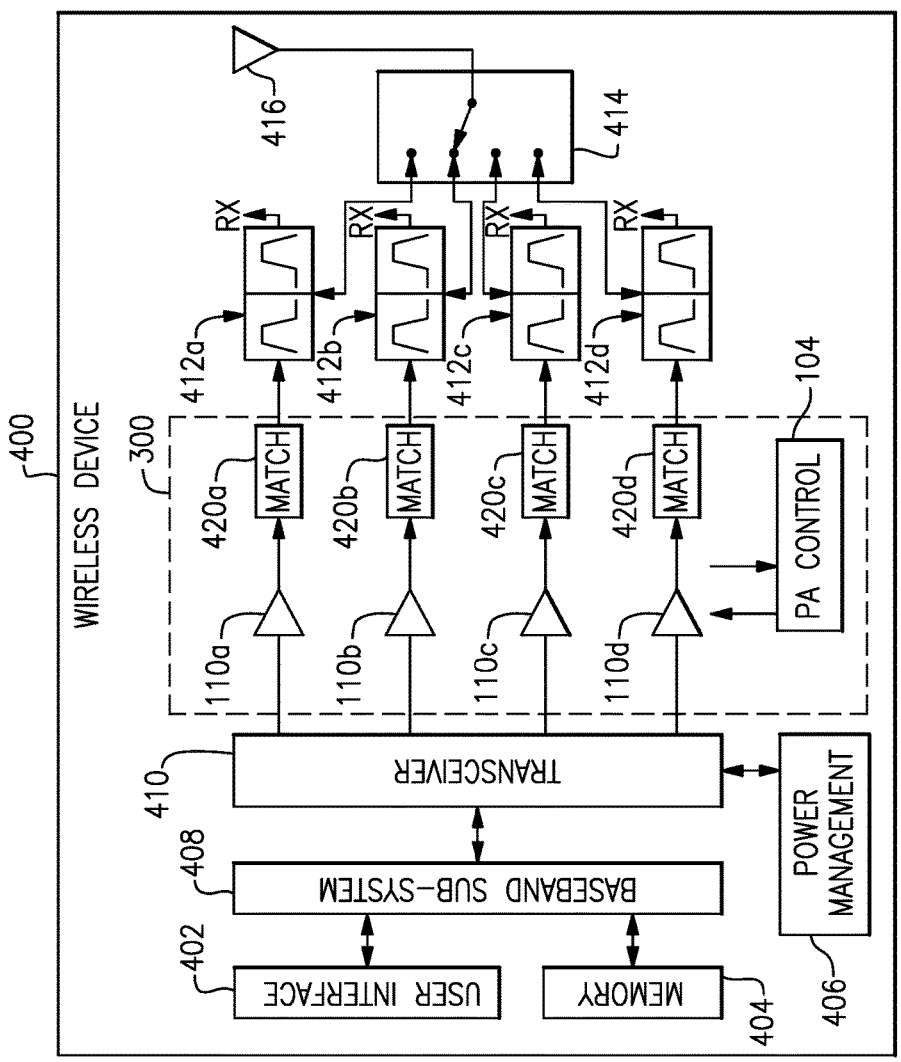
FIG. 20 depicts an example wireless device having one or more advantageous features as described herein.

FIG. 20 schematically depicts an example wireless device 400 having one or more advantageous features described herein. In the context of a control circuit for a PA, one or more PAs 110 as described herein are shown to be controlled by a PA control circuit 104. Such PAs and controller can facilitate, for example, multi-band operation of the wireless device 400. In embodiments where the PAs and their matching circuits are packaged into a module, such a module can be represented by a dashed box 300. Such a module can include either or both of a switchable feedback circuit and a switchable base feed circuit as described herein.

The PAs 110 can receive their respective RF signals from a transceiver 410 that can be configured and operated to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 is also shown to be connected to a power management component 406 that is configured to manage power for the operation of the wireless device. Such power management can also control operations of the baseband sub-system 408 and the module 300.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, outputs of the PAs 110 are shown to be matched (via match circuits 420) and routed to an antenna 416 via their respective duplexers 412a-412d and a band-selection switch 414. The band-selection switch 414 can include, for example, a single-pole-multiple-throw (e.g., SP4T) switch to allow selection of an operating band (e.g., Band 2). In some embodiments, each duplexer 412 can allow transmit and receive operations to be performed simultaneously using a common antenna (e.g., 416). In FIG. 12, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

General Comments

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency amplifier comprising:
an amplifying transistor configured to amplify a signal, and having an input and an output; and
a feedback circuit implemented between the output and input of the amplifying transistor, and including a parallel assembly of a switch and a first resistive element such that the first resistive element is bypassed when the switch is ON and an overall resistance of the feedback circuit includes the first resistive element when the switch is OFF, the feedback circuit further including a second resistive element in series with the parallel assembly, such that the overall resistance of the feedback circuit has a first value without the first resistive element when the switch is ON, and a second value including resistance values of the first and second resistive elements when the switch is OFF, the resistance value of the second resistive element selected to facilitate a first gain of the amplifying transistor when the switch is ON.

2. The radio-frequency amplifier of claim 1 wherein the feedback circuit is configured to be capable of providing a plurality of resistance values between the output and input of the amplifying transistor to facilitate different gains of the amplifying transistor.

3. The radio-frequency amplifier of claim 1 wherein the second value of the overall resistance of the feedback circuit is approximately the sum of the resistance values of the first and second resistive elements.

4. The radio-frequency amplifier of claim 1 wherein the switch is implemented as a field-effect transistor.

5. The radio-frequency amplifier of claim 1 wherein the resistance value of the first resistive element of the parallel assembly is selected to facilitate a second gain of the amplifying transistor when the switch is OFF.

6. The radio-frequency amplifier of claim 1 wherein the amplifying transistor is configured to provide power amplification for the signal.

7. The radio-frequency amplifier of claim 1 wherein the amplifying transistor is implemented as a bipolar junction transistor.

8. The radio-frequency amplifier of claim 7 wherein the bipolar junction transistor is configured as a heterojunction bipolar transistor that includes a base, a collector, and an emitter, such that the base is the input and the collector is the output.

9. The radio-frequency amplifier of claim 7 wherein the switch is implemented as a field-effect transistor.

10. The radio-frequency amplifier of claim 1 wherein the feedback circuit further includes a DC block capacitance to inhibit passage of a supply voltage from the output to the input.

11. The radio-frequency amplifier of claim 10 wherein the DC block capacitance is implemented between the parallel assembly and the output.

12. The radio-frequency amplifier of claim 1 wherein each of the first and second resistive elements includes a resistor.

13. The radio-frequency amplifier of claim 12 wherein each resistor includes a TaN thin film resistor.

14. The radio-frequency amplifier of claim 1 wherein the amplifying transistor is part of a stage of an amplification path having a plurality of stages.

15. The radio-frequency amplifier of claim 14 wherein each of the plurality of stages includes the feedback circuit.

16. A semiconductor die comprising:
a semiconductor substrate; and
a power amplifier circuit implemented on the semiconductor substrate and including an amplifying transistor configured to amplify a signal and having an input and an output, the power amplifier circuit further including a feedback circuit implemented between the output and input of the amplifying transistor, and including a parallel assembly of a switch and a first resistive element such that the first resistive element is bypassed when the switch is ON and an overall resistance of the feedback circuit includes the first resistive element when the switch is OFF, the feedback circuit further including a second resistive element in series with the parallel assembly, such that the overall resistance of the feedback circuit has a first value without the first resistive element when the switch is ON, and a second value including resistance values of the first and second resistive elements when the switch is OFF, the resistance value of the second resistive element selected to facilitate a first gain of the amplifying transistor when the switch is ON.

17. The semiconductor die of claim 16 wherein the semiconductor substrate is configured such that the amplifying transistor is implemented as a heterojunction bipolar transistor.

18. The semiconductor die of claim 17 wherein the semiconductor substrate is configured such that the switch is implemented as a bipolar field-effect transistor.

19. A wireless device comprising:
a transceiver configured to generate a signal;
a power amplifier circuit in communication with the transceiver and including an amplifying transistor configured to amplify a signal and having an input and an output, the power amplifier circuit further including a feedback circuit implemented between the output and input of the amplifying transistor, and including a parallel assembly of a switch and a first resistive element such that the first resistive element is bypassed when the switch is ON and an overall resistance of the feedback circuit includes the first resistive element when the switch is OFF, the feedback circuit further including a second resistive element in series with the parallel assembly, such that the overall resistance of the feedback circuit has a first value without the first resistive element when the switch is ON, and a second value including resistance values of the first and second resistive elements when the switch is OFF, the resistance value of the second resistive element selected to facilitate a first gain of the amplifying transistor when the switch is ON; and
an antenna in communication with the power amplifier circuit and configured to facilitate transmission of the amplified signal.

20. The wireless device of claim 19 wherein the wireless device is configured to operate in the first mode in which the power amplifier circuit has the first gain when the switch is ON, and to operate in a second mode in which the power amplifier circuit has a second gain when the switch is OFF.

* * * * *